United States Patent [19]
Roh

[11] Patent Number: 5,783,253
[45] Date of Patent: Jul. 21, 1998

[54] METHOD FOR FORMING A DIELECTRIC FILM AND METHOD FOR FABRICATING A CAPACITOR USING THE SAME

[75] Inventor: Jae Sung Roh, Kyungki-do, Rep. of Korea

[73] Assignee: LG Semicon Co., Ltd., Cheongju, Rep. of Korea

[21] Appl. No.: 810,919

[22] Filed: Mar. 5, 1997

[30] Foreign Application Priority Data

Sep. 7, 1996 [KR] Rep. of Korea ............... 38788/1996

[51] Int. Cl.⁶ ........................................................ B05D 5/12
[52] U.S. Cl. ........................ 427/81; 427/79; 427/248.1; 427/255.7; 427/419.3
[58] Field of Search .............................. 427/81, 79, 248.1, 427/255.7, 419.3

[56] References Cited

U.S. PATENT DOCUMENTS 5,383,088  1/1995  Chapple-Sokol et al. ............... 361/305
5,626,906  5/1997  Summer et al. ........................ 427/126.3
5,635,741  6/1997  Tsu et al. .............................. 257/310

OTHER PUBLICATIONS

Yuuki, A., et al., "Novel Stacked Capacitor Technology for I Gbit DRAMs with CVD–(Ba,Sr)TiO₃ Thin Films on a Thick Storage Node of Ru," IEDM–95–115, pp. 5.2.1–5.2.4, 1995.

Primary Examiner—Roy V. King
Attorney, Agent, or Firm—Fleshner & Kim

[57] ABSTRACT

The present invention provides a method of forming a high strength dielectric film which provides a high dielectric constant for a high density device, and a method of fabricating a capacitor using such a method. The method includes a two step process where one of the steps provides a composition BST layer serving as a nucleation layer. For example, a BST layer having a composition of $Ba_xSr_{1-x}TiO_3$, where X has a range of about 0 to 0.4. Another BST layer having a composition of $Ba_xSr_{1-x}TiO_3$ is provided, where X is about 0.5. Such a method provides a high dielectric film with a very smooth surface, compared to conventional methods.

19 Claims, 6 Drawing Sheets

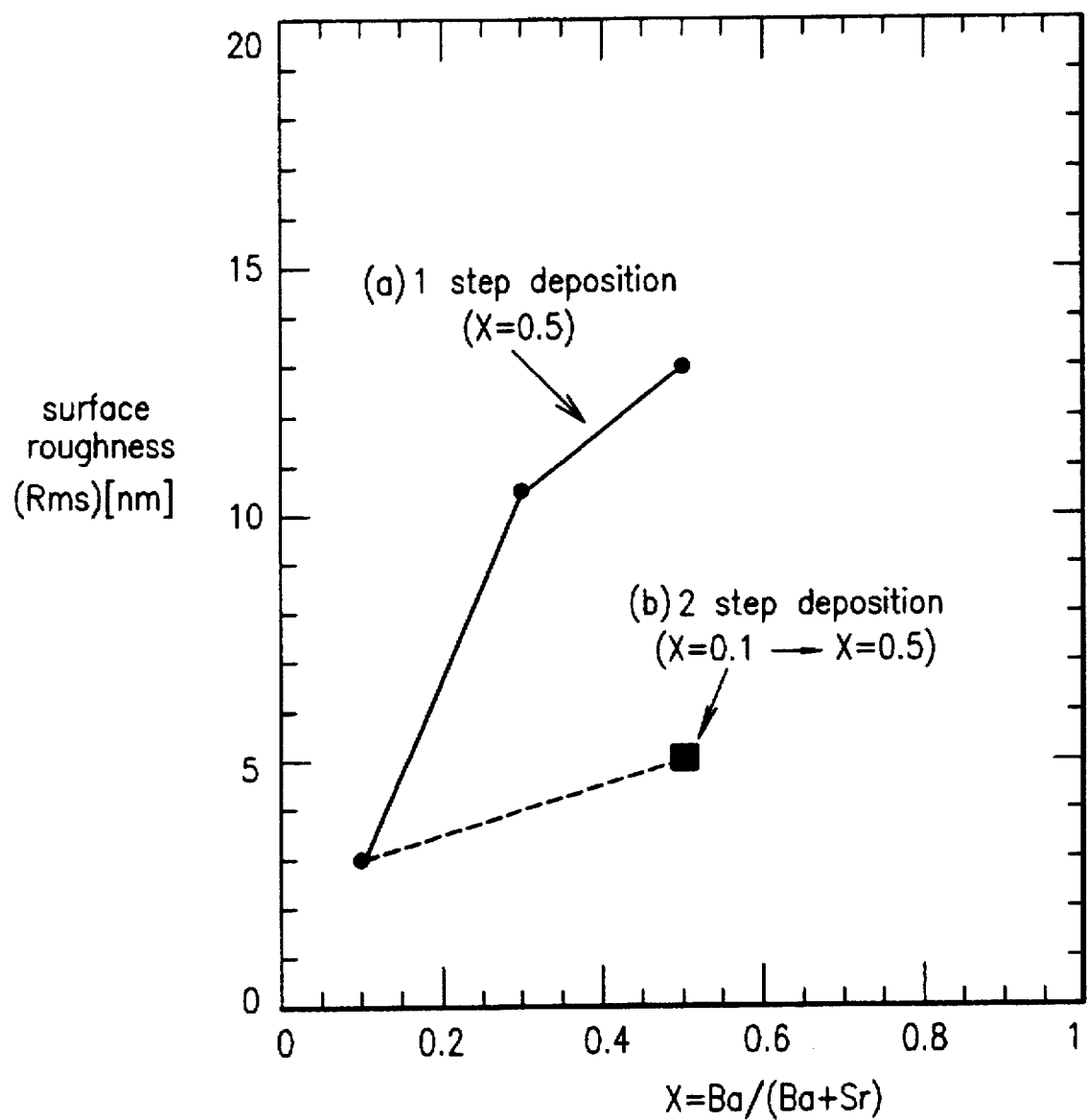

METHOD FOR FORMING A DIELECTRIC FILM AND METHOD FOR FABRICATING A CAPACITOR USING THE SAME

BACKGROUND OF THE INVENTION

1. Field of the Invention

The present invention relates to a method of fabricating a dielectric film, and more particularly, to a method of fabricating a capacitor having a dielectric film made from such a method.

2. Background of the Related Art

As high density packing of devices, such as 256 DRAM class, increases, development of a dielectric film of a higher dielectric constant and a smooth surface with improved physical and electrical properties is required. Accordingly, a dielectric film generally formed by a one-step deposition is formed by a two step deposition method to obtain a dielectric film having a higher dielectric constant.

FIGS. 1a–1e illustrate the various steps of the conventional method for fabricating a capacitor using the conventional two step method of forming a high strength dielectric film. Generally, a first dielectric film of a predetermined composition is deposited to a thickness thinner than the total required thickness and heat treated; and a second dielectric film is deposited thereon, up to a total required thickness, and heat treated.

Referring to FIG. 1a, an insulating film 2 is deposited on a substrate 1, and a photoresist film is coated on the insulating film 2. The photoresist is subjected to exposure and development for selective removal and is used as a mask in etching the insulating film 2 to form a hole. Polysilicon is deposited on the entire surface and selectively removed to leave the polysilicon in the hole, thereby forming a plug 3. Ruthenium is sputtered onto the insulating film 2 and the polysilicon plug 3 to form an underside electrode 4 of the capacitor, and thereafter, a silicon oxide film 5 is deposited.

Referring to FIG. 1b, a photoresist film is coated on the silicon oxide film 5 and is subjected to exposure and development to selectively remove the photoresist such that the photoresist covering the polysilicon plug 3 is left. The silicon oxide film 5 is etched to expose a predetermined portion of the underside electrode 4 using the remaining photoresist film as a mask.

The underside electrode 4 is subjected to anisotropic etching to expose a predetermined portion of the insulating film 2 using the remaining photoresist film as a mask. After the photoresist film is removed, a first BST dielectric film 6 of a predetermined composition is deposited on the exposed insulating film 2 and the underside electrode 4 by MOCVD (Metal-Organic Chemical Vapor Deposition) and subjected to RTA (Rapid Thermal Annealing), as illustrated in FIG. 1c.

As shown in FIG. 1d, a second BST dielectric film 7 of a predetermined composition is again deposited to a predetermined thickness by MOCVD and subjected to RTA to improve a surface roughness of the second BST dielectric film 7. Ruthenium is sputtered on the second BST dielectric film 7 to form an upperside electrode 8 of the capacitor (see FIG. 1e).

The aforementioned conventional method for fabricating a capacitor has various problems. For example, separate and repeated deposition and annealing process, involving back and forth movement between an MOCVD equipment and a RTA equipment for the two kinds of processes, are complicated. Further, the exposure of the dielectric film to the atmosphere due to the repeated deposition and annealing may contaminate and degrade the electrical characteristics of the dielectric film.

SUMMARY OF THE INVENTION

Accordingly, it is an object of the present invention to solve one or more of the problems and disadvantages of the related art.

To achieve these and other advantages are achieved in whole or in part by a method for forming a high strength dielectric film which includes the steps of providing a substrate, forming a first composition BST layer on the substrate, and forming a second composition BST layer on the first composition BST layer.

The above objects, features and advantages may be achieved in part or in whole by a method of forming a dielectric film for a capacitor having first and second electrodes, comprising the steps of forming a nucleation layer of $Ba_xSr_{1-x}TiO_3$, where X is less than 0.5, on the first electrode; and forming a composition BST layer between said nucleation layer and the second electrode The method of fabricating a capacitor may comprise the steps of: (a) forming an insulating film on a substrate; (b) selectively etching the insulating film to expose the substrate to form a contact hole; (c) forming an underside electrode to the exposed contact hole; (d) forming a first composition BST layer on the insulating film and the underside electrode; (e) forming a second composition BST layer on the first composition BST layer; and (f) forming an upperside electrode on the second composition BST layer Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings. It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein:

FIG. 4 is a graph showing measurements of surface roughness vs. composition of the dielectric films shown in FIGS. 3a and 3b.

DETAILED DESCRIPTION OF PREFERRED EMBODIMENTS

A BST dielectric film composed of barium and strontium varies in its physical properties depending on variation of a ratio of the composition. For example, when the amounts of barium and strontium within the composition are the same, the BST film exhibits the maximum dielectric constant. As the ratio of the barium in the composition increases, the nucleation sites at which nuclei start to form are reduced to form a rough surfaced dielectric film. Therefore, in order to increase points at which the nuclei start to form at an initial stage, less amount of the barium within the composition is provided.

In the present invention, a method for forming a dielectric film over two steps is employed for obtaining a dielectric film having a smooth surface and a high dielectric constant. FIGS. 2a-2e illustrate the steps of a method for fabricating a capacitor having a high strength dielectric film in accordance with a preferred embodiment of the present invention.

Figure 1A:
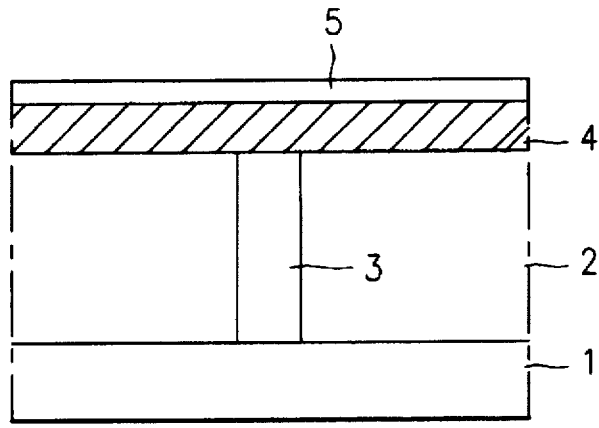
FIGS. 1a–1e illustrate the steps of a conventional method for fabricating a capacitor.
Figure 1B:
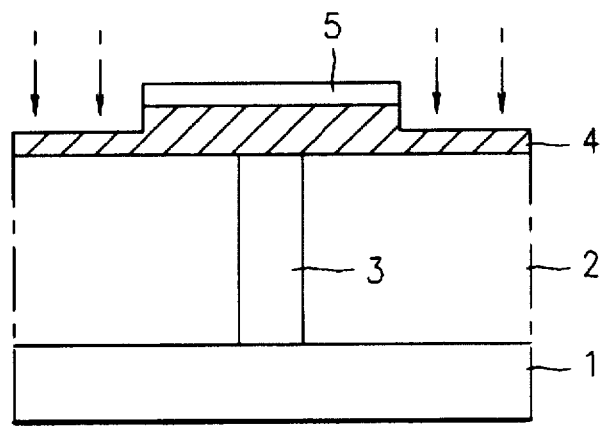
Figure 1C:
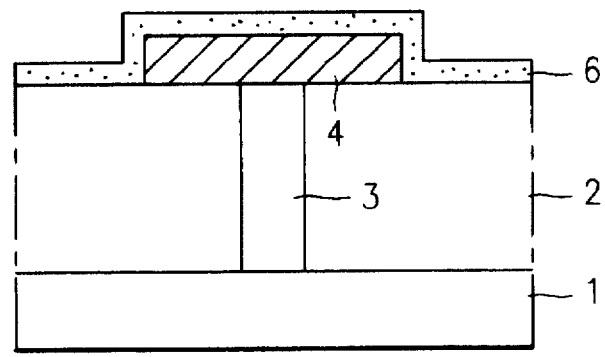
Figure 1D:
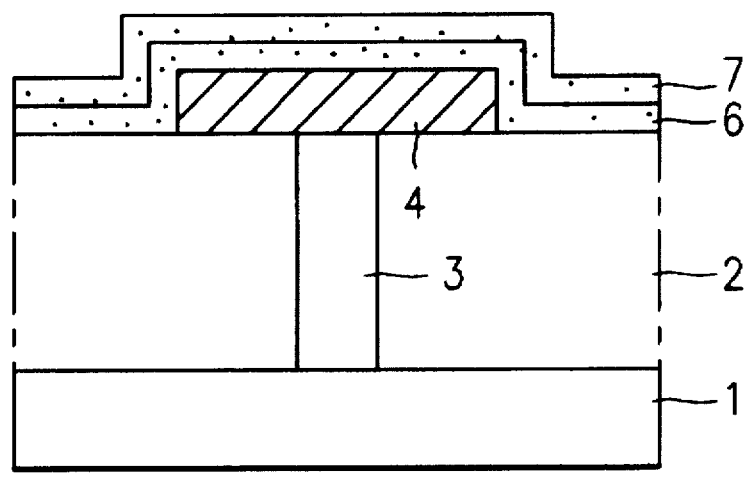
Figure 1E:
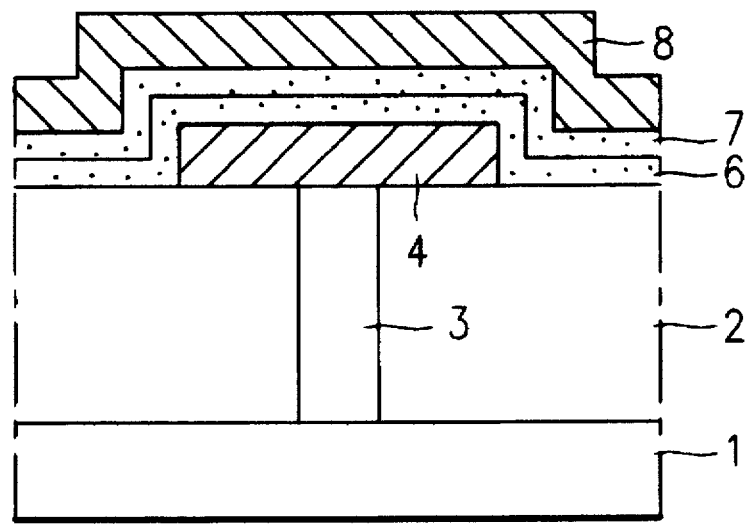
Figure 2A:
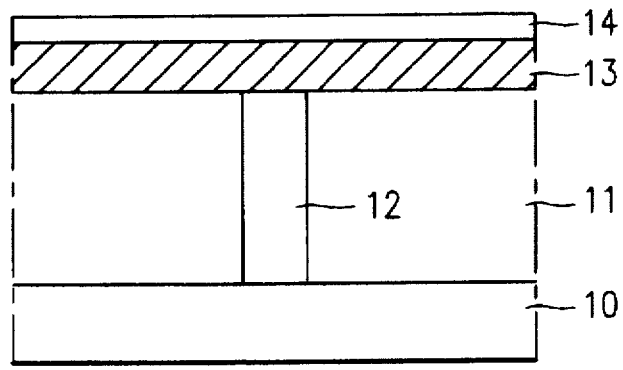
FIGS. 2a–2e illustrate the steps of a method for fabricating a capacitor having a high strength dielectric film in accordance with a preferred embodiment of the present invention.

Referring to FIG. 2a, an insulating film 11 is deposited on a substrate 10 and a photoresist film is coated thereon. The photoresist film is subjected to exposure and development to selectively remove the photoresist film. Using the remaining photoresist film, the insulating film 11 is etched to form a hole in the insulating film 11. Polysilicon is deposited on the entire surface and removed to leave the polysilicon in the hole, thereby forming a plug 12. An underside electrode 13 of ruthenium is sputtered on the insulating film 11 and the polysilicon plug 12 and a silicon oxide film 14 is formed thereon.

Figure 2B:
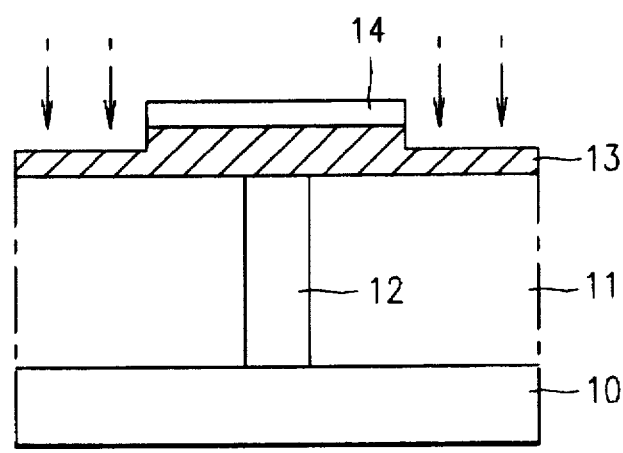

A photoresist film is coated on the entire surface of the silicon oxide film 14 including the polysilicon plug 12 and subjected to exposure and development to selectively pattern the photoresist film. The silicon oxide film 14 is etched to expose predetermined portions of the underside electrode 13 using the remaining photoresist film as a mask, as shown in FIG. 2b. The underside electrode 13 is subjected to anisotropic etching to expose predetermined portions of the insulating film 11 using the remaining photoresist film as a mask. Thereafter, the photoresist film is removed.

Figure 2C:
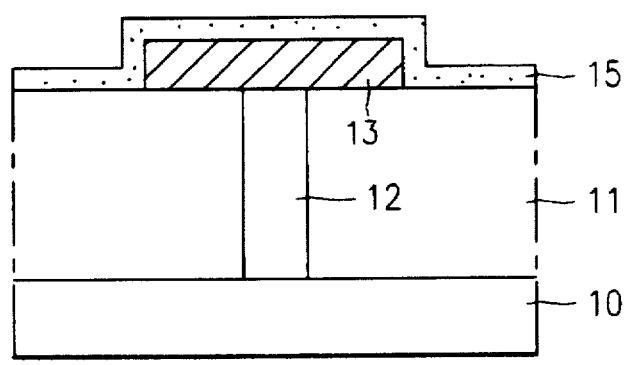

In order to form a dielectric film of a smooth surface on the insulating film 11 and the underside electrode 13, numerous points from which surface nuclei start to form should be provided at an initial stage. To achieve a smooth surface, a BST layer is formed by MOCVD (Metal-Organic Chemical Vapor Deposition). The MOCVD is performed under a pressure of 0.1~10 Torr at a temperature ranging 400–650 deg. C. to deposit a BST layer 15 having a thickness ranging 20~200 Å, with a ratio of barium to entire barium and strontium {Ba/(Ba+Sr)} controlled by X, which has a range of about 0~0.4, as shown in FIG. 2c. For example, in case X is 0.1, a first dielectric film 15 of $Ba_{0.1}Sr_{0.9}TiO_3$ is formed.

Figure 2D:
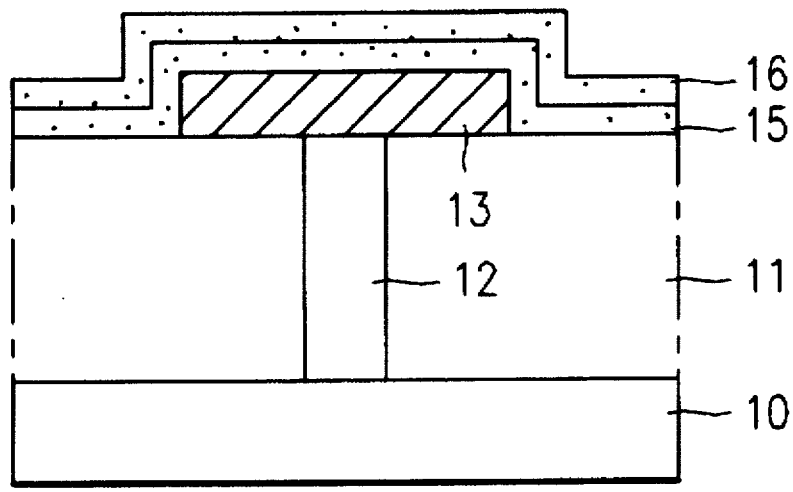
Figure 2E:
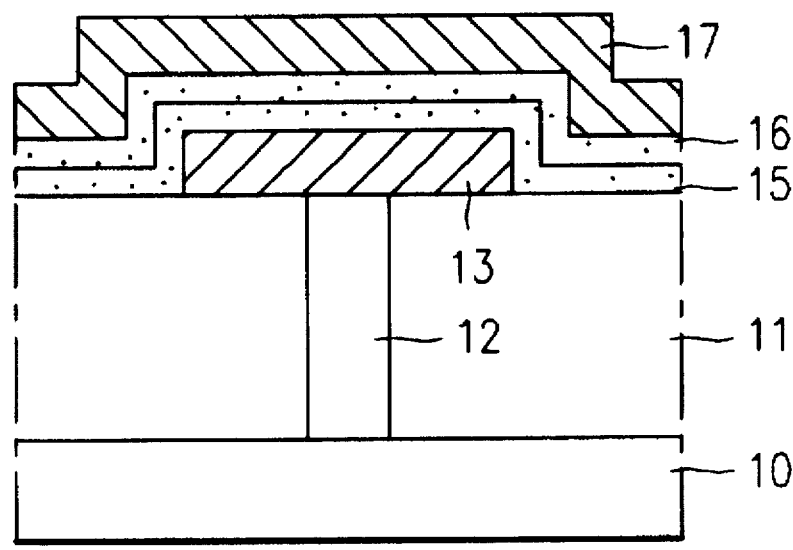

As shown in FIG. 2d, a second dielectric film 16 of $Ba_{0.5}Sr_{0.5}TiO_3$ is formed by MOCVD (Metal-Organic Chemical Vapor Deposition) under a pressure of 0.1~10 Torr at a temperature which is the same or below the temperature used in forming the first dielectric film (400~650 deg. C.) to a thickness ranging 300~1500 Å, with a ratio of barium to entire barium and strontium {Ba/(Ba+Sr)} controlled by X of about 0.5 When the first dielectric film 15 and the second dielectric film 16 are thus formed, the total thickness is much thicker than the conventional ones, and a smooth surfaced high strength dielectric film can be formed with substantially no dielectric constant loss. An upperside electrode 17 of ruthenium is sputtered on the second dielectric film 16 to complete the fabrication of a capacitor using the present method for forming a high strength dielectric film, as shown in FIG. 2e.

Figure 3A:
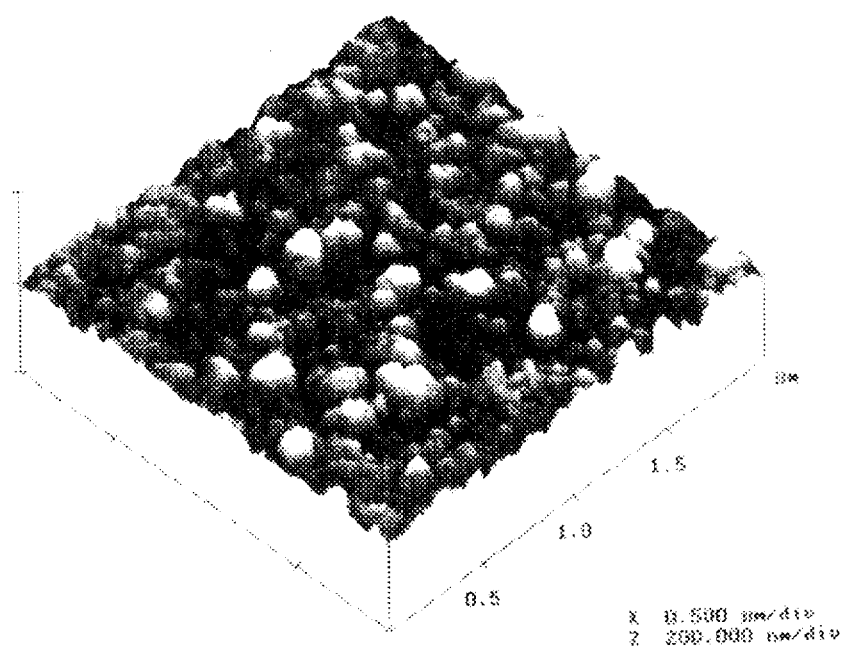
FIG. 3a illustrates an AFM photograph of a surface of a dielectric film formed using a method of the related art.
Figure 3B:
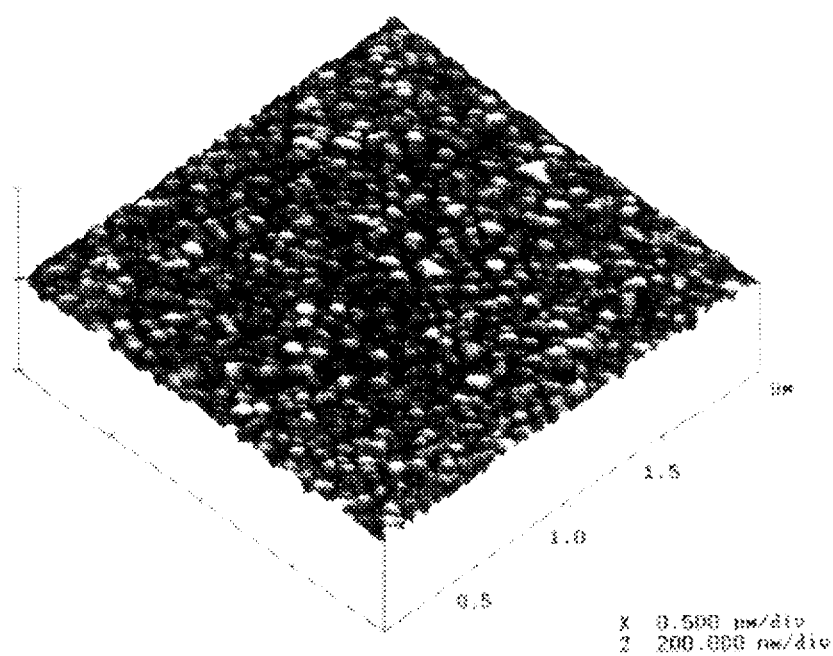
FIG. 3b illustrates an AFM photograph of a surface of a dielectric film formed in two steps in accordance with a preferred embodiment of the present invention.

FIG. 3a illustrates an AFM photograph showing a surface of a dielectric film formed by a conventional method, and FIG. 3b illustrates an AFM photograph showing a surface of a high strength dielectric film formed in accordance with a preferred embodiment of the present invention. As shown in FIG. 3a, the surface AFM photograph of the BST film having a composition of $Ba_{0.5}Sr_{0.5}TiO_3$, formed using the method of the related art is rough because such a composition of $Ba_{0.5}Sr_{0.5}TiO_3$ forms less nucleation sites. Unlike the conventional dielectric film, as shown in FIG. 3b, the surface AFM photograph of the BST film formed by the method of the present invention in two steps is smoother, because the first dielectric film 15 with a composition of, e.g., $Ba_{0.1}Sr_{0.9}TiO_3$ is first formed as a nucleation layer, and the second dielectric film 16 with a composition of $Ba_{0.5}Sr_{0.5}TiO_3$ is formed thereon.

FIG. 4 is a graph showing measurements of surface roughness vs. composition of the dielectric films shown in FIGS. 3a and 3b. As shown by the legend (a) representing data from FIG. 3a, there are less nucleation sites because there is no nucleation layer formed when the dielectric film of $Ba_{0.5}Sr_{0.5}TiO_3$ with a barium composition ratio of 0.5 is formed in a conventional one-step method. The surface roughness continues to increase until the composition ratio X reaches to 0.5. Unlike the conventional method, the legend (b) representing data from FIG. 3b indicates a smoother surface than a process when X is about 0.5 for both the first and second dielectric films 15 and 16. The dielectric film 15 of $Ba_{0.1}Sr_{0.9}TiO_3$ is first formed as a nucleation layer, and thereafter, the second dielectric film 16 of $Ba_{0.5}Sr_{0.5}TiO_3$ is formed, in two steps.

The method for forming a dielectric film and the method for fabricating a capacitor with such a dielectric film in accordance with the present invention have various advantages. For example, since a nucleation layer of a lower barium composition ratio is deposited to 20~200 Å and a dielectric film of a desired composition is deposited in succession, resulting in a much thicker thickness than actually desired, the method for forming a dielectric film of the present invention can form a very smoother dielectric film and improve the physical properties of the dielectric film. Further, the continuous in-situ formation of the dielectric film within one equipment also facilitates simple fabrication and improves productivity.

It will be apparent to those skilled in the art that various modifications and variations can be made in method for fabricating semiconductor device of the present invention without departing from the spirit or scope of the invention. It is intended that the present invention cover the modifications and variations of this invention provided within the scope of the appended claims and their equivalents.

What is claimed is:

1. A method of forming a dielectric film comprising the steps of:

(a) providing a substrate;

(b) forming a first barium strontium titanate (BST) dielectric layer on the substrate, the first BST dielectric layer having a first composition; and (c) forming a second BST dielectric layer on the first BST dielectric layer, the second BST dielectric layer having a second composition that is different than the first composition.

2. The method of claim 1, wherein the first composition is $Ba_xSr_{1-x}TiO_3$, where X has a range of about 0~0.4.

3. The method of claim 1, wherein the first BST dielectric layer and the second BST dielectric layer are directly deposited using a common MOCVD system.

4. The method of claim 1, wherein the first BST dielectric layer is formed under a pressure of about 0.1~10 Torr at a temperature range of about 400–650 deg. C. to a thickness of about 20–200 Å.

5. The method of claim 1, wherein the second BST dielectric layer is formed under a pressure of about 0.1–10 Torr at a temperature below 650 deg. C. to a thickness of about 300–1500 Å.

6. The method of claim 1, wherein the second composition is $Ba_xSr_{1-x}TiO_3$, where X is about 0.5.

7. The method of claim 1, wherein the first BST dielectric layer and the second BST dielectric layer are continuously deposited in situ.

8. A method of fabricating a capacitor comprising the steps of:

(a) forming an insulating film on a substrate;

(b) selectively etching the insulating film to expose the substrate to form a contact hole;

(c) forming an underside electrode to the exposed contact hole;

(d) forming a first barium strontium titanate (BST) dielectric layer on the insulating film and the underside electrode, the first BST dielectric layer having a first composition;

(e) forming a second BST dielectric layer on the first BST dielectric layer, the second BST dielectric layer having a second composition that is different than the first composition; and (f) forming an upperside electrode on the second BST dielectric layer.

9. The method of claim 8, wherein the first composition is $Ba_xSr_{1-x}TiO_3$, where X has a range of about 0–0.4.

10. The method of claim 8, wherein the second composition is $Ba_xSr_{1-x}TiO_3$, where X is about 0.5.

11. The method of claim 8, wherein the first BST dielectric layer and the second BST dielectric layer are directly deposited using a common MOCVD system.

12. The method of claim 8, wherein the first BST dielectric layer and the second BST dielectric layer are continuously deposited in situ.

13. A method of forming a dielectric film for a capacitor having first and second electrodes, comprising the steps of:

forming a nucleation dielectric layer of $Ba_xSr_{1-x}TiO_3$, where X is less than 0.5, on the first electrode; and forming a composition barium strontium titanate (BST) dielectric layer between said nucleation layer and the second electrode, wherein the composition BST dielectric layer has a different composition than the nucleation dielectric layer.

14. The method of claim 13, wherein said nucleation dielectric layer is formed under of pressure of about 0.1 to 10 Torr.

15. The method of claim 14, wherein said nucleation dielectric layer is formed at a temperature range of about 400 to 650 degree Celsius.

16. The method of claim 13, wherein said nucleation dielectric layer has a thickness of about 20 Å to 200 Å.

17. The method of claim 13, wherein said composition BST dielectric layer is formed under a pressure of about 0.1 Torr to 10 Torr below a temperature of about 650 degree Celsius.

18. The method of claim 13, wherein said composition BST dielectric layer has a thickness range of about 300 Å to 1500 Å.

19. The method of claim 13, wherein said composition BST dielectric layer has a composition of $Ba_xSr_{1-x}TiO_3$, where X is about 0.5.

* * * * *